(12) United States Patent
Yoo et al.

(10) Patent No.: US 7,799,627 B2
(45) Date of Patent: Sep. 21, 2010

(54) MULTI DEVICE AND METHOD OF MANUFACTURING THE SAME

(75) Inventors: Jae-Hyun Yoo, Gangnam-gu (KR); Jong-Min Kim, Gangnam-gu (KR)

(73) Assignee: Dongbu HiTek Co., Ltd., Seoul (KR)

( * ) Notice: Subject to any disclaimer, the term of this patent is extended or adjusted under 35 U.S.C. 154(b) by 12 days.

(21) Appl. No.: 12/326,898

(22) Filed: Dec. 3, 2008

(65) Prior Publication Data

US 2009/0146220 A1    Jun. 11, 2009

(30) Foreign Application Priority Data

Dec. 5, 2007    (KR) .................... 10-2007-0125304

(51) Int. Cl.
*H01L 21/336* (2006.01)
*H01L 21/8234* (2006.01)

(52) U.S. Cl. ............... 438/197; 257/287; 257/E29.013; 257/E29.278; 257/E21.435

(58) Field of Classification Search .................. 257/392, 257/287, 336, 344, 408, E29.013, E29.278, 257/21.435; 438/197, 199
See application file for complete search history.

(56) References Cited

U.S. PATENT DOCUMENTS 6,267,479 B1 * 7/2001 Yamada et al. ............... 257/392
6,800,909 B2 * 10/2004 Sugiyama et al. ........... 257/408

* cited by examiner

*Primary Examiner*—Davienne Monbleau
*Assistant Examiner*—Monica D Harrison
(74) *Attorney, Agent, or Firm*—Sherr & Vaughn, PLLC

(57) ABSTRACT

Embodiments relate to a multi device that may include a first MOS transistor having a first gate oxide film, and a second MOS transistor having a second gate oxide film thicker than the first gate oxide film. According to embodiments, a LDD structure of the first MOS transistor may be a two-layered structure in which a first LDD region and a second LDD region are disposed vertically downward from the surface of a wafer, and the second LDD region is substantially the same as an LDD structure in the second MOS transistor in doping concentration.

Figure 1A:
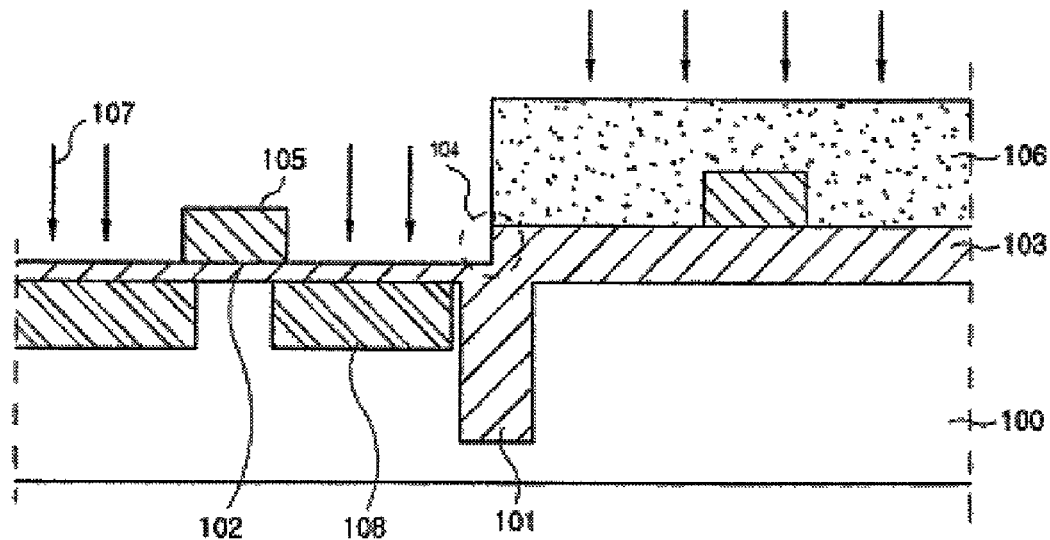

20 Claims, 4 Drawing Sheets

MULTI DEVICE AND METHOD OF MANUFACTURING THE SAME

The present application claims priority under 35 U.S.C. 119 to Korean Patent Application No. 10-2007-0125304 (filed on Dec. 5, 2007), which is hereby incorporated by reference in its entirety.

BACKGROUND

More than one semiconductor integrated device may be manufactured on a single wafer to facilitate integrating devices having different electrical characteristics into a semiconductor chip. Such an integrated semiconductor device may be called a multi device. For example, a multi device may include a low voltage metal-oxide semiconductor (MOS) transistor operating at 1.5 V and a high voltage MOS transistor operating at 3.3 V. These two devices may be formed in the same semiconductor chip.

In manufacturing a multi device, an additional masking step may be needed, as compared with a manufacturing process of a single integrated device having devices with common electrical characteristics. One reason may be as follows. To form devices having different electrical characteristics in a multi device, physical characteristics, such as a device size, a thickness of the oxide film, and a concentration of an impurity implanted into the silicon surface, may be different from each other. Generally, it may be difficult to simultaneously form devices having different physical characteristics under optimum process conditions.

For example, in a high voltage MOS transistor, a high voltage may be applied to a gate electrode. To provide for device stability, a gate oxide film may need to be formed thicker than a gate oxide film in a low voltage MOS transistor. In this case, a step may exist between the gate oxide films in the same wafer. It may be difficult to form the gate oxide films having a step in a single process using a known oxidation process. Therefore, after the gate oxide film for the high voltage transistor is formed, the gate oxide film for the low voltage transistor may be formed.

The gate oxide film for the low voltage transistor maybe formed as follows. First, a photosensitive film may be applied. Next, the photosensitive film corresponding to a region where the low voltage transistor is to be formed may be removed by using an exposure process with a mask. Next, the gate oxide film in the region where the low voltage transistor is to be formed may be removed by a predetermined thickness using an etching process. In this way, gate oxide films having a step may be formed. Hence, an additional masking step may be needed.

Devices having different physical characteristics may have different electrical characteristics. In some instances, the devices may need to be manufactured separately. For example, an ion implantation process may be performed to form a lightly doped drain (LDD) structure which may prevent current leakage due to drain induced barrier lowering (DIBL) in a MOS transistor. In a multi device, the ion implantation process may be performed separately for a low voltage MOS transistor and a high voltage MOS transistor to achieve different electrical characteristics.

Figure 1B:
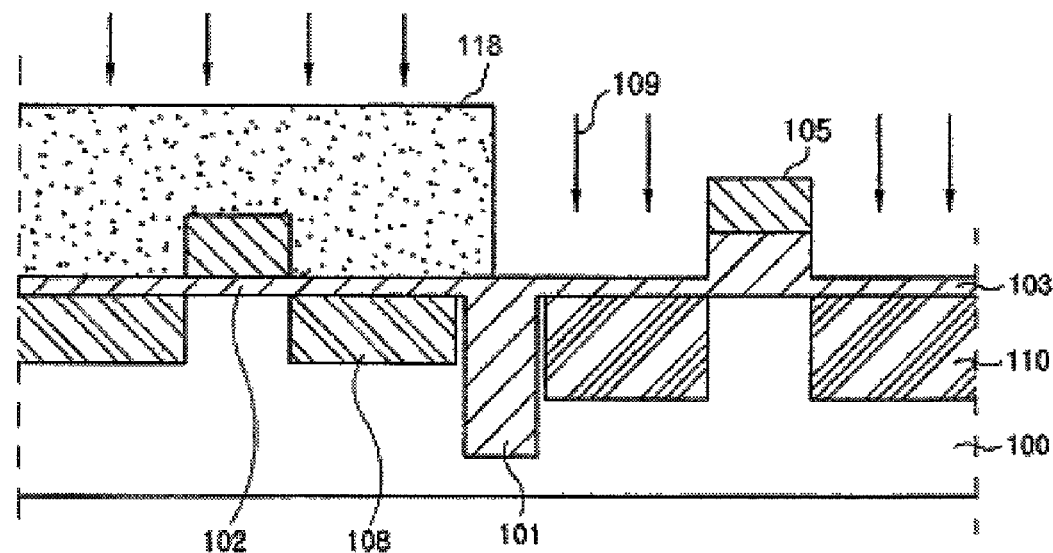
Figure 1C:
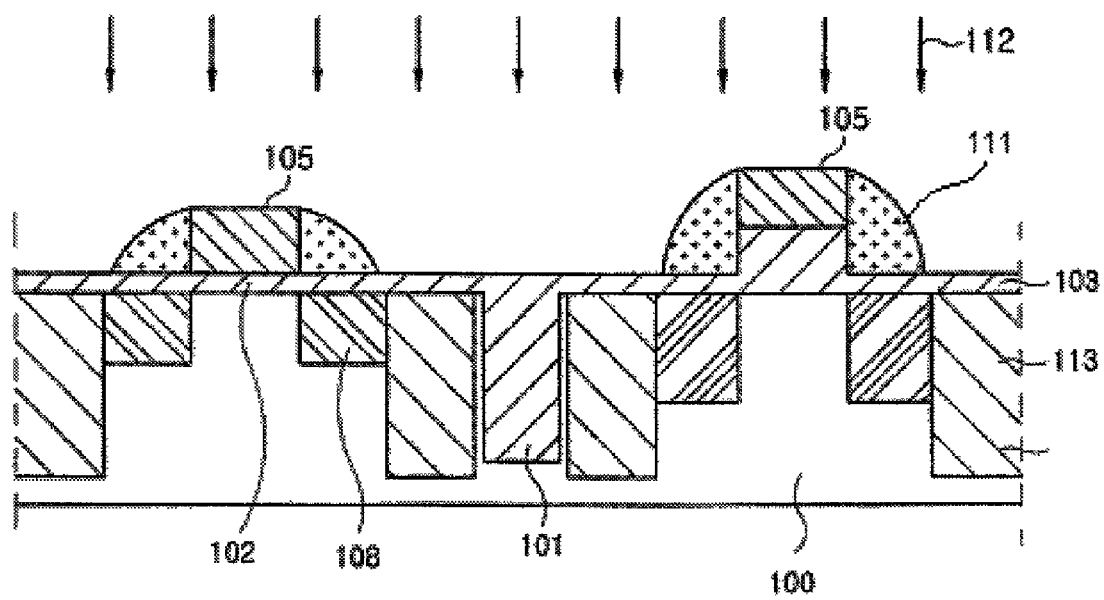

FIGS. 1A-1C illustrate a related art LDD ion implantation process for a multi device having a low voltage transistor and a high voltage transistor. Referring to FIG. 1A, field oxide film 101 may be formed on and/or over silicon wafer 100. First gate oxide film 102 for a low voltage MOS transistor and second gate oxide film 103 for a high voltage MOS transistor may then be formed. Step 104 may thereby exist between first gate oxide film 102 and second gate oxide film 103 due to a difference in thickness between them.

Gate 105, which may include polysilicon, may then be formed on and/or over first and second gate oxide films 102, 103. An ion implantation process may then be performed, and may result in formation of an LDD structure. The ion implantation process may be performed separately for the low voltage MOS transistor and the high voltage MOS transistor. This may be because different ion implantation conditions may be necessary to form the LDD structures of the respective transistors.

Thus, referring to FIG. 1A, a photosensitive film may be applied to an entire surface of the wafer. Next, photosensitive film 118 corresponding to the low voltage MOS transistor may be removed by using an exposure process, while photosensitive film 106 corresponding to the high voltage MOS transistor may remain. Ion implantation process 107 may be performed, and may form LDD structure 108 of the low voltage MOS transistor. After the ion implantation process for the low voltage MOS transistor is completed, photosensitive film 106 corresponding to the high voltage MOS transistor may be removed.

To form an LDD structure in the high voltage MOS transistor using an ion implantation process, in the same manner as described above, a photosensitive film may be applied and an exposure process may be performed. Referring to FIG. 1B, photosensitive film 106 corresponding to the high voltage MOS transistor may be removed, while photosensitive film 118 corresponding to the low voltage MOS transistor may remain. Next, ion implantation process 109 may be performed, and may form LDD structure 110 for the high voltage MOS transistor.

Referring to FIG. 1C, step 104 between the gate oxide films may be removed. Spacers 111 may be formed on side surfaces of each gate. Ion implantation process 112 may then be performed, and may form source/drain regions 113 of the transistors.

Ion implantation processes to form each LDD structure may be performed separately for the high voltage MOS transistor and the low voltage MOS transistor. That is, when LDD ion implantation is performed for one transistor, a photosensitive film may be formed to block ion implantation into the other transistor. Hence, an additional masking step may be needed. The need of an additional masking step may increase a cost for a mask and may increase a number of steps in a manufacturing process. This could delay product development.

SUMMARY

Embodiments relate to a multi device including MOS transistors with gate oxide films of different thicknesses, and a method of forming a lightly doped drain (LDD) structure of each MOS transistor using an ion implantation process after the gate oxide films are formed.

Embodiments relate to a multi device and a method of manufacturing a multi device including MOS transistors with gate oxide films of different thicknesses, which may be capable of successively performing ion implantation to form LDD structures in the individual MOS transistors by using a difference in thickness between the gate oxide films and a difference in LDD ion implantation energy without needing an additional masking step. This may simplify a manufacturing process.

According to embodiments, a method may include at least one of the following. Forming, on an entire surface of a wafer, a first gate oxide film used for a first MOS transistor and a second gate oxide film used for a second MOS transistor and formed to be thicker than the first gate oxide film, to provide a predetermined step. Performing a first ion implantation process to form an LDD structure in the first MOS transistor such that ions to be implanted exist within a depth corresponding to the step from an upper surface of the second gate oxide film. Performing a second ion implantation process to form an LDD structure in the second MOS transistor. Removing the step due to the difference in thickness between the first gate oxide film and the second gate oxide film. Performing a third ion implantation process to form source/drain regions in the first and second MOS transistors.

According to embodiments, a multi device may include at least one if the following. A first MOS transistor having a first gate oxide film. A second MOS transistor having a second gate oxide film thicker than the first gate oxide film.

According to embodiments, an LDD structure of the first MOS transistor may be a two-layered structure in which a first LDD region and a second LDD region may be disposed vertically downward from a surface of a wafer, and the second LDD region may be substantially the same as an LDD structure in the second MOS transistor in doping concentration.

DRAWINGS

FIGS. 1A-1C illustrate a method of forming an LDD structure in a multi device including MOS transistors with gate oxide films of different thicknesses according to the related art.

Example FIGS. 2A-2D illustrate a method of forming an LDD structure in a multi device including MOS transistors with gate oxide films of different thicknesses according to embodiments.

DESCRIPTION

According to embodiments, a multi device may include a low voltage first MOS transistor and a high voltage second MOS transistor. The first MOS transistor may have a first gate oxide film of a comparatively small thickness and the second MOS transistor may have a second gate oxide film of a comparatively large thickness.

Figure 2A:
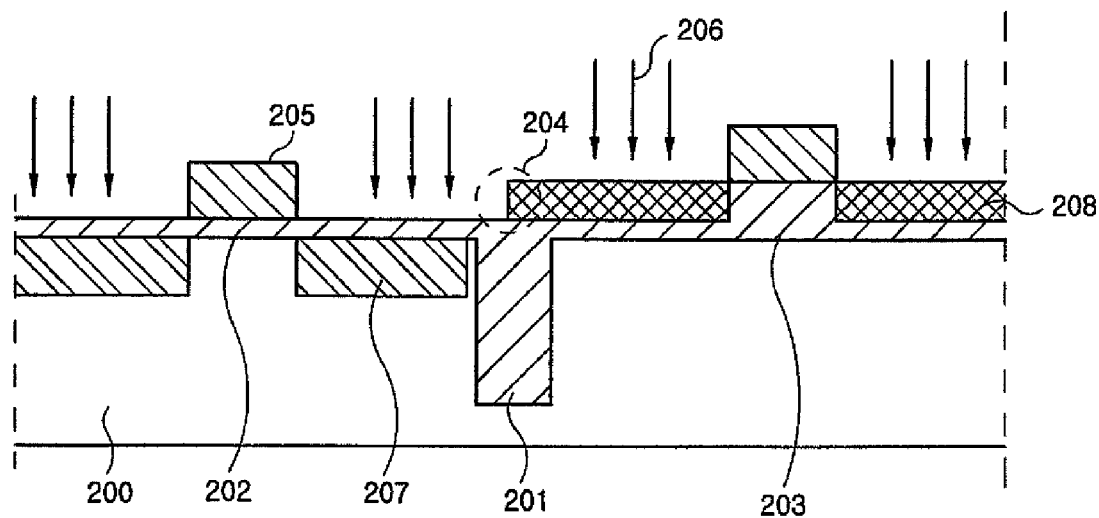

Referring to example FIG. 2A, field oxide film 201, first gate oxide film 202, and second gate oxide film 203 may be formed on and/or over wafer 200. Gate 205, which may include polysilicon, may be formed on and/or over both first gate oxide film 202 and second gate oxide film 203. According to embodiments, first gate oxide film 202 may have a thickness ranging from approximately 30 to 80 Å. Second gate oxide film 203 may have a thickness ranging from approximately 140 to 180 Å. A difference in thickness between first gate oxide film 202 and second gate oxide film 203, which is step difference 204, may be in a range of approximately 60 to 150 Å.

To form first LDD region 207 of the first MOS transistor on and/or over wafer 200, on which field oxide film 201, first gate oxide film 202, and second gate oxide film 203 may be formed, ion implantation process 206 may be performed with no mask. Thus, first LDD region 207 may be formed.

In ion implantation process 206 to form first LDD region 207, energy may be adjusted such that ions implanted may be transmitted through first gate oxide film 202 and may be implanted into a surface of the wafer, but they may not transmit through second gate oxide film 203. Instead they may be confined inside second gate oxide film 203. According to embodiments, an ion implantation process may be performed such that the ions to be implanted may exist within depth portion 208 corresponding to a difference in thickness between first and second gate oxide films 202, 203 from an upper surface of second gate oxide film 203.

According to embodiments, this adjustment may be made because second gate oxide film 203 may be formed to be thicker than first gate oxide film 202. Thus ion transmission ability may be different in first and second gate oxide films 202, 203. According to embodiments, first and second gate oxide films 202, 203 may have different thicknesses through which ions may pass with substantially the same ion implantation energy. Therefore, by adjusting a difference in thickness between first and second gate oxide films 202, 203, accelerated ions may transmit through first gate oxide film 202, but may not transmit through second gate oxide film 203. Rather, they may be confined inside of second gate oxide film 203.

According to embodiments, an adjustment may be made so that the implanted ions are substantially all confined within a depth corresponding to the step between first and second gate oxide films 202, 203 from the upper surface of second gate oxide film 203. This may confine the ions in depth portion 208 that may be removed when depth portion 208 (i.e. step difference 204) is subsequently removed.

According to embodiments, when first and second gate oxide films 202, 203 have substantially the above described thicknesses, first ion implantation process 206 may be performed using As (Arsenic) ions at a dose in a range of approximately $1 \times 10^{14}$ to $5 \times 10^{14}$ ions/cm$^2$, and with an implantation energy in a range of approximately 3 to 10 keV.

Figure 2B:
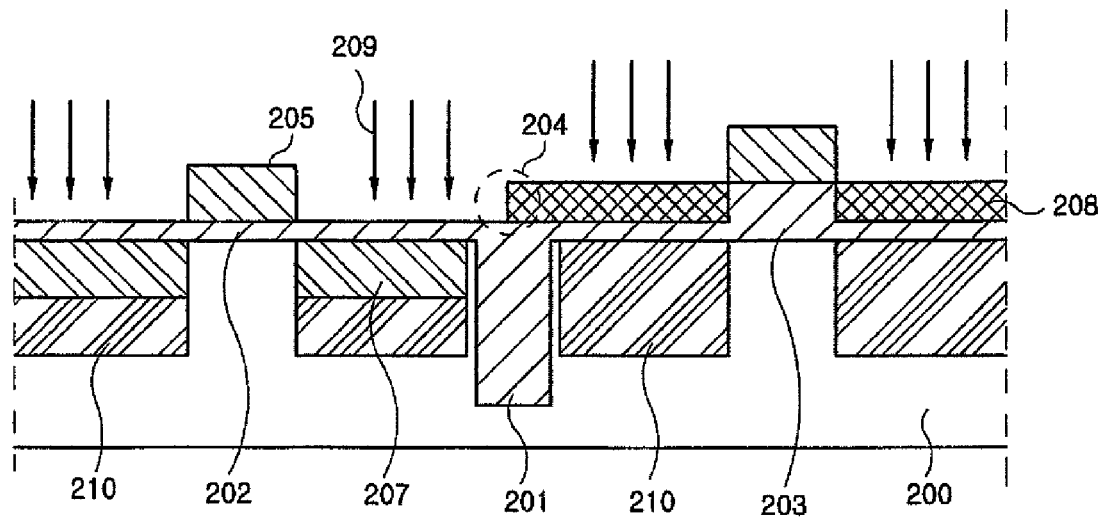

Referring to example FIG. 2B, second ion implantation process 209 may be performed after first ion implantation process 206 is completed. This may form second LDD region 210 of the second MOS transistor. In second ion implantation process 209, ions may transmit through second gate oxide film 203, which may be formed comparatively thicker than first gate oxide film 202, and may be implanted into a surface of the wafer.

According to embodiments, second ion implantation process 209 may be performed with an ion implantation energy higher than that used in first ion implantation process 206. Therefore, in second ion implantation process 209, the ions may transmit through second gate oxide film 203 and may form second LDD region 210 in the second MOS transistor and may also transmit through first gate oxide film 202 and may form an LDD region in the first MOS transistor.

Referring to example FIG. 2B, the LDD structure in the first MOS transistor may be a two-layered structure in which first LDD region 207 previously formed and second LDD region 210 are disposed vertically downward from a surface of the wafer. This may be because the second ion implantation energy may be higher than the first ion implantation energy. Thus second LDD region 210 may be formed deeper downward from a surface of the wafer than first LDD region 207.

According to embodiments, if the gate oxide films have substantially the above described thicknesses, second ion implantation process 209 may be performed using P (Phosphorous) ions, with a dose of ions in a range of approximately $1 \times 10^{13}$ to $5 \times 10^{13}$ ions/cm$^2$, and at an implantation energy in a range of approximately 10 to 20 keV.

Figure 2C:
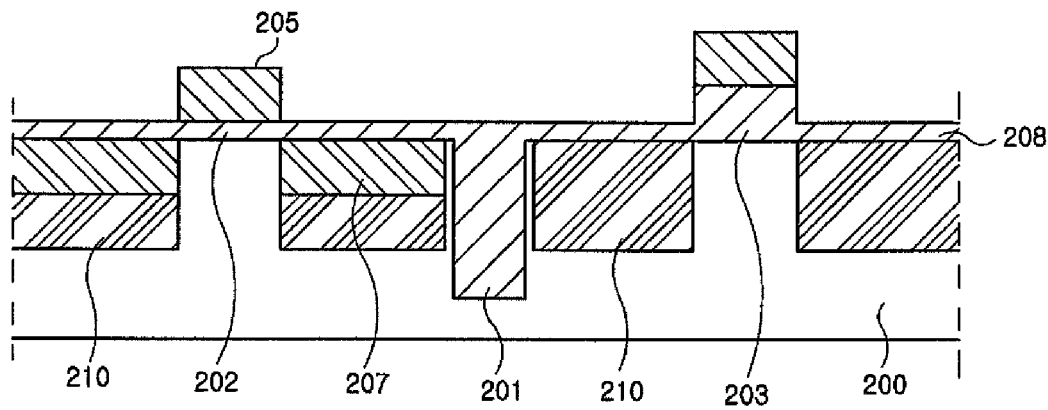

Referring to example FIG. 2C, after second ion implantation process 209 is completed, step difference 204 between first gate oxide film 202 and second gate oxide film 203 may be removed. By removing step difference 204, depth portion 208 of second gate oxide film 203, in which ions implanted during first ion implantation process 206 may have been confined, may be removed. This may prevent the electrical characteristics of the MOS transistor, such as a threshold voltage or a breakdown voltage of the gate oxide film, from deteriorating due to impurities in the gate oxide film.

Figure 2D:
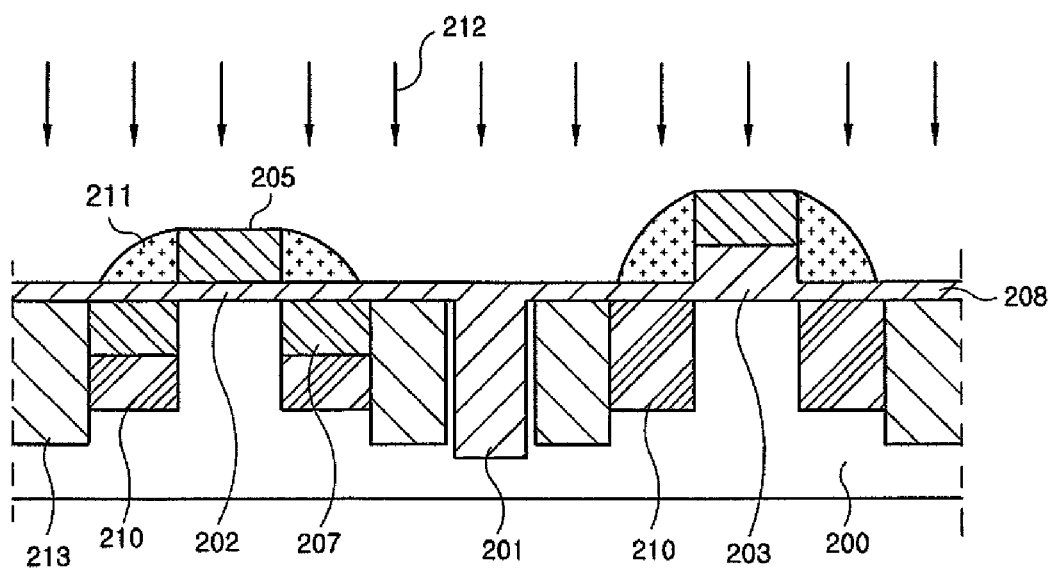

Referring to example FIG. 2D, spacers 211 may then be formed on side surfaces of each gate, and third ion implantation process 212, which may form source/drain regions 213 of the transistors, may be performed.

It will be obvious and apparent to those skilled in the art that various modifications and variations can be made in the embodiments disclosed. Thus, it is intended that the disclosed embodiments cover the obvious and apparent modifications and variations, provided that they are within the scope of the appended claims and their equivalents.

What is claimed is:

1. A method, comprising:
    forming a first gate oxide film having a first thickness for a first MOS transistor and a second gate oxide film having a second thickness for a second MOS transistor over a surface of a wafer, the second thickness being greater than the first thickness to provide a step difference in thickness;
    performing a first ion implantation process to form an LDD structure in the first MOS transistor such that ions to be implanted over the second MOS transistor exist within a depth corresponding to the step difference in thickness between the first gate oxide film and the second gate oxide film from an upper surface of the second gate oxide film;
    performing a second ion implantation process to form an LDD structure in the second MOS transistor; and
    removing the step difference in thickness between the first gate oxide film and the second gate oxide film.

2. The method of claim 1, comprising forming spacers on side surfaces of the first and second MOS transistors.

3. The method of claim 2, comprising performing a third ion implantation process to form source/drain regions in the first and second MOS transistors.

4. The method of claim 1, wherein the first gate oxide film has a thickness ranging from approximately 30 to 80 Å, and the second gate oxide film has a thickness ranging from approximately 140 to 180 Å.

5. The method of claim 1, wherein a height of the step is in a range of approximately 60 to 150 Å.

6. The method of claim 1, wherein the first ion implantation process is performed with a dose of As (Arsenic) ions ranging from approximately $1\times10^{14}$ to $5\times10^{14}$ ions/cm$^2$.

7. The method of claim 6, wherein an ion implantation energy ranges from approximately 3 to 10 keV.

8. The method of claim 7, wherein the second ion implantation process is performed with a dose of P (Phosphorous) ions ranging from approximately $1\times10^{13}$ to $5\times10^{13}$ ions/cm$^2$ and an ion implantation energy ranging from approximately 10 to 20 keV.

9. The method of claim 1, wherein the second ion implantation process is performed with a dose of P (Phosphorous) ions ranging from approximately $1\times10^{13}$ to $5\times10^{13}$ ions/cm$^2$.

10. The method of claim 9, wherein an ion implantation energy ranges from approximately 10 to 20 keV.

11. The method of claim 1, wherein the first MOS transistor is configured to operate at a voltage of approximately 1.8 V and the second MOS transistor is configured to operate at a voltage of approximately 3.3 V.

12. A device, comprising:
    a first MOS transistor having a first gate oxide film of a first thickness; and
    a second MOS transistor having an operation voltage higher than an operation voltage of the first MOS transistor and a second gate oxide film of a second thickness, the second thickness being greater than the first thickness,
    wherein an LDD structure of the first MOS transistor comprises a two-layered structure in which a first LDD region and a second LDD region are disposed vertically downward from a surface of a wafer, and the second LDD region is approximately equal in doping concentration to an LDD structure of the second MOS transistor.

13. The device of claim 12, wherein the first gate oxide film has a thickness ranging from approximately 30 to 80 Å, and the second gate oxide film has a thickness ranging from approximately 140 to 180 Å.

14. The device of claim 12, wherein a difference in thickness between the first gate oxide film and the second gate oxide film is in a range of approximately 60 to 150 Å.

15. The device of claim 12, wherein the first LDD region is formed with a dose of As (Arsenic) ions that ranges from approximately $1\times10^{14}$ to $5\times10^{14}$ ions/cm$^2$.

16. The device of claim 15, wherein the first LDD region is formed with an ion implantation energy that ranges from approximately 3 to 10 keV.

17. The device of claim 16, wherein the second LDD region is formed with a dose of P (phosphorous) that ranges from approximately $1\times10^{13}$ to $5\times10^{13}$ ions/cm$^2$.

18. The device of claim 17, wherein the second LDD region is formed with an ion implantation energy that ranges from approximately 10 to 20 keV.

19. The device of claim 12, wherein the first MOS transistor is configured to operate at a voltage of approximately 1.8 V and the second MOS transistor is configured to operate at a voltage of approximately 3.3 V.

20. The device of claim 12, comprising spacers on side surfaces of the first and second MOS transistors.

* * * * *